United States Patent [19]

Vigezzi et al.

[11] Patent Number: 4,915,797

[45] Date of Patent: Apr. 10, 1990

[54] CONTINUOUS PROCESS FOR COATING PRINTED CIRCUIT GRADE COPPER FOIL WITH A PROTECTIVE RESIN

[75] Inventors: Lawrence E. Vigezzi, West Trenton; Adam M. Wolski, Edgewater Park, both of N.J.

[73] Assignee: Yates Industries, Inc., Bordentown, N.J.

[21] Appl. No.: 356,213

[22] Filed: May 24, 1989

[51] Int. Cl.$^4$ .................. C25D 7/06; C25D 13/16
[52] U.S. Cl. .................. 204/28; 204/38.7; 204/180.4
[58] Field of Search .............. 204/28, 38.7, 180.4

[56] References Cited

U.S. PATENT DOCUMENTS

| | | | |
|---|---|---|---|
| 3,850,773 | 11/1974 | Lupinski | 204/180.8 |
| 3,853,716 | 12/1974 | Yates | 204/28 |
| 4,469,565 | 9/1984 | Hampel | 204/28 |

Primary Examiner—T. M. Tufariello
Attorney, Agent, or Firm—Finnegan, Henderson, Farabow, Garrett & Dunner

[57] ABSTRACT

A continuous process for electrocoating a thin, uniform protective resinous coating, e.g., an epoxy or acrylic resin, on a matte surface of printed circuit grade copper foil, the matte surface having been treated to increase its surface area, and for curing the coating to obtain improved, high quality copper foil for use in printed circuit boards.

11 Claims, 2 Drawing Sheets

CONTINUOUS PROCESS FOR COATING PRINTED CIRCUIT GRADE COPPER FOIL WITH A PROTECTIVE RESIN

FIELD OF INVENTION

This invention relates to copper foil, such as is used for printed circuit applications. More particularly, it relates to the application of a resinous, protective coating to printed circuit grade copper foil and to the products produced thereby.

BACKGROUND OF THE INVENTION

Printed electronic circuits are commonly produced by bonding metal foil to a substrate, usually a synthetic polymer, to form a laminated structure, followed by etching to form the desired circuit. Copper foil is generally used for making such printed circuits, and the copper foil may be produced by rolling or by electrodeposition, although the latter is preferred.

In order to enhance the bonding strength of the foil to the substrate, electrodeposited copper foil is typically produced with a matte surface on one side of the foil which has an increased surface area compared to a smooth surface. To further increase the surface area, and hence the bonding strength, the matte surface often is subjected to further electrochemical treatment to electrolytically form a dendritic copper layer on the matte surface. Also, a two-step electrochemical copper pre-treatment, as disclosed in U.S. Pat. No. Re. 30,180, issued to Wolski and Yates, may be used to further improve the bond strength of the copper foil.

Another problem faced in the manufacture of copper foil is staining or oxidation of the surface of the foil which may occur between the time of manufacture and the time of use by the purchaser. Such staining or oxidation, which may occur during exposure to the atmosphere or as a result of other conditions, is especially undesirable when the foil is intended for use in printed circuit applications, which require very high quality copper foil. Various electrolytic methods have been used for stain-proofing copper foil, for example, the electrolytic application to the foil's surface of hexavalent chromium anions as disclosed in U.S. Pat. No. 3,853,716 issued to Yates and Wolski. While such stain-proofing methods improve the resistance of the foil to staining and corrosion, they have not been found entirely satisfactory as the quality standards for printed circuit foil have been raised. Consequently, other methods have been employed in attempting to improve the resistance to staining and corrosion of the foil.

One such method used is a physical coating method for applying a thin coating of a paint to the surface of the foil, for example, by brushing or spraying. Such methods, however, have been found to be relatively costly, and to present environmental problems. Further, physical coating methods do not provide a completely satisfactory product, in that it is difficult to obtain an even distribution of the paint on the foil, pin-holes tend to occur in the coating and air voids form between the coating and the roughened surface of the foil.

The electrodeposition method has been used to apply paint to fabricated metal parts, such as automobile chassis, furniture and appliance cabinets and the like. Also, U.S. Pat. No. 3,850,773 discloses a continuous electrodeposition method for coating electrical conductors, such as wire and metal foil, with polyamide enamel. This method, however, has not been used prior to the present invention to coat printed-circuit grade copper foil in a continuous electrolytic process, even though a commercially feasible process of this type is highly desirable. Further, until the present invention there has not been developed a commercial electrodeposition process of the above type capable of providing printed-circuit grade copper foil capable of meeting the presently required high quality standards and which can be produced in a satisfactory cost-effective manner.

An object of the present invention is to overcome the draw-backs in prior coatings applied to copper foil and the methods of forming such coatings by providing an improved method of forming a resinous electrocoating on a copper foil. Another object is such a method providing a coating which improves the shelf life of the foil and also makes the foil easier to handle.

A further object of the present invention is a method of forming a resinous coating on copper foil for printed circuit applications which coating has a high dielectric-breakdown voltage, is free of pin-holes, has a high degree of purity and insignificant ion movement or electron tunneling when the thickness is greater than 100Å. Still, a further object is a method of forming a very thin protective resinous coating on such a copper foil which prevents both surface and contact corrosion, as well as preventing contact of zinc alloys with the copper face side of the foil in roll form.

Yet, another object of the present invention is an economic and cost-effective method for coating copper foil which enables the production of a high quality copper foil suitable for use in printed circuit application.

Additional objects and advantages of the present invention will be set forth in part in the description which follows, and in part will be obvious from the description or may be learned by practice of the present invention. The objects and advantages of the invention may be realized and attained by means of the instrumentalities and combinations particularly pointed out in the appended claims.

SUMMARY OF THE INVENTION

To achieve the objects and in accordance with the purpose of the present invention there is provided a continuous process for electrodepositing a polymeric resinous coating on a surface of a treated copper foil which process comprises passing a continuous strip of copper foil, at least one side of which has a matte surface which has been treated to increase its surface area, through a bath of a cationic electrodeposition paint in an electrolytic cell, the paint comprising an aqueous dispersion of particles of the resin to be electrodeposited; rendering the treated surface of the foil cathodic with respect to an insoluble anode spaced apart from the foil in the cell; maintaining an electric potential between the treated surface of the foil and said anode und.r electrodeposition conditions to electrodeposit a uniform coating of the resin on the treated surface of the foil; and curing the deposited resin to form a solid, protective coating of the resin on the treated surface of the foil.

The coating is preferably an epoxy or acrylic resin, which after curing has a thickness of from about 0.4 to about 3.0 mils, and preferably from 0.8 to 1.2 mils. Also, in accordance with the preferred process, the foil is coated only on the treated surface.

The accompanying drawings, which are incorporated in and constitute a part of this specification, illustrate preferred embodiments of apparatus for carrying out the process of the present invention, and together with the description, serve to explain the principles of the invention.

DESCRIPTION OF THE PREFERRED EMBODIMENTS OF THE INVENTION

Figure 1:
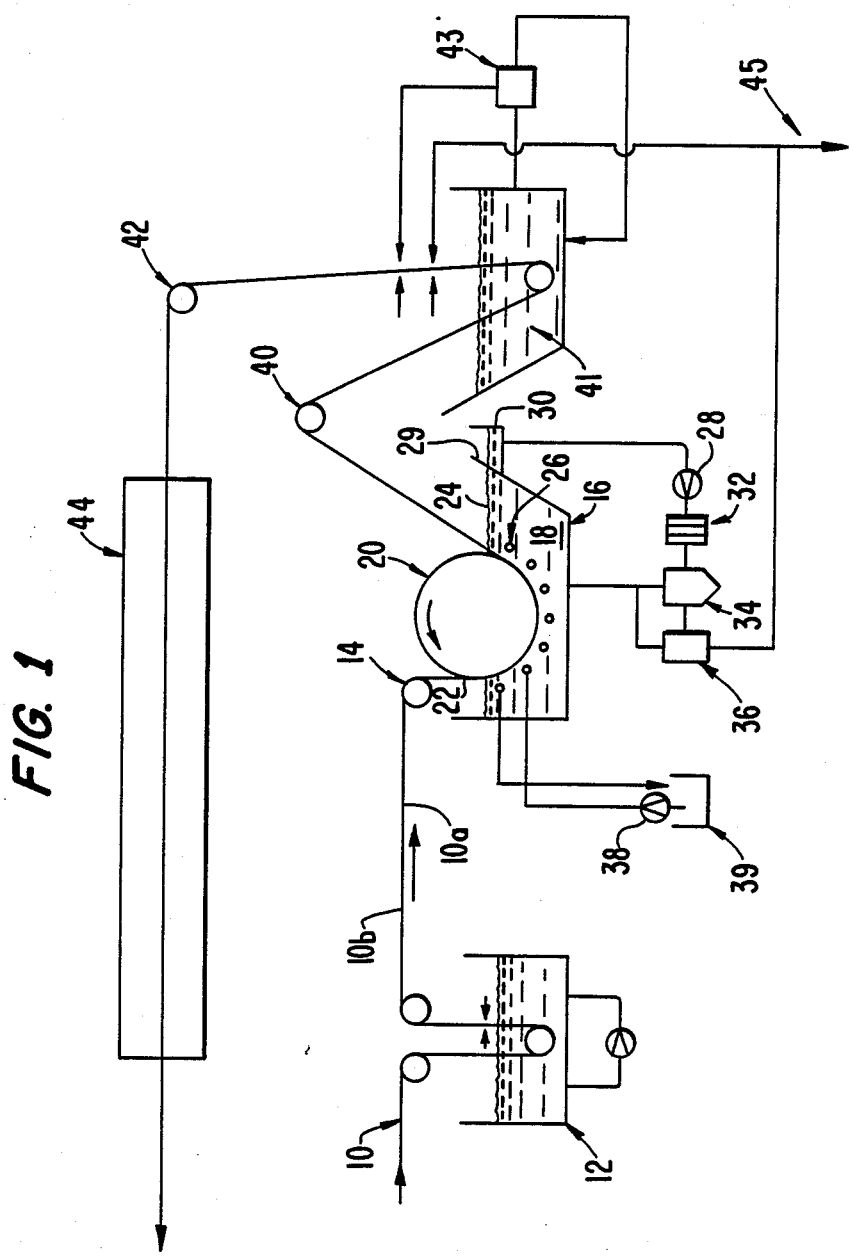
FIG. 1 is a schematic drawing illustrating one embodiment of apparatus for conducting the process of the present invention to continuously rinse, electrocoat, rinse and cure a polymer coating on copper foil.

In accordance with the present invention the foil to be coated is typically ½ oz. or 1 oz. copper foil, preferably produced by the electrodeposition technique. The foil may be from 0.75 mils to 3.70 mils thick, and preferably is from 0.90 mils to 2.0 mils thick. The foil should meet I.P.C. Specification No. IPC-MF-150E. Such electrolytic foil is produced with a matte finish on one side thereof, thereby providing a surface having improved bonding strength when laminated to resin and glass cloth prepregs used in the manufacture of printed circuit boards. The matte side is the side of the foil exposed to the electrolyte during electrodeposition of the copper on a drum cathode. Although both sides of the copper foil can be electrocoated if required, typically only the matte side of the foil is coated.

While the electrocoating may be applied directly on the matte surface of the raw foil, i.e., the foil as produced, it is preferred that the matte surface is treated, prior to the electrocoating, to further increase the surface area of the foil. Such surface treatment further increases the foil's surface area, and hence its bonding strength, by forming a roughened copper layer on the matte surface. The copper layer may be formed by a known electrochemical treatment to provide a dendritic copper layer on the matte surface. It is most preferred, however, that the foil first be pre-treated by a two-step electrochemical pre-treatment using an arsenic and copper-containing electrolyte to form a first copper layer, followed by a second electrochemical treatment using a copper-containing electrolyte to electrodeposit a gilding copper layer on the first layer. Following the pre-treatment, in a final treatment step a third layer of microcrystalline copper is elettrodeposited on the second layer of the pre-treatment step to further increase the bonding strength of the foil. The above pretreatment and final treatment techniques are more fully described in U.S. Letters Pat. No. Re. 30,180 the disclosure of which is incorporated herein by reference.

Advantageously, the treated copper foil is further subjected to a stain-proofing treatment prior to the electrocoating step to further enhance the resistance of the foil to staining and oxidation. Such stain-proofing may be performed by a known electrolytic method. It is preferred, however, that such stain-proofing be performed by electrolytically precipitating on the treated foil's surface copper and chromium ions from an alkaline aqueous electrolyte containing hexavalent chromium ion-containing anions, as disclosed in U.S. Letters Pat. No. 3,853,716, the disclosure of which is incorporated herein by reference.

As a result of the above treatment, the surface of the foil has microscopic surface irregularities, which while increasing the bonding strength, render it difficult to apply thereto a tightly adherent thin resin coating which is impermeable to air and moisture.

It has been found that, because of such surface irregularities, physical methods hereto used to apply resinous coatings to the treated foil surface result in coatings having pin-holes, minute air voids between the foil surface and the coating and non-uniform distribution of the resin on the foil. Through experimentation, however, it has been found that an unexpectedly superior very thin resin coating can be obtained by electrocoating the treated surface of foil under specific electrodeposition conditions with cationic epoxy and cationic acrylic electrodeposition resins.

The cationic electrodeposition paints useful in the practice of the present invention are constituted of particles of a polymeric resin suspended in water, which particles have been given positive electrostatic charges on the outside of their long carbon chains. When the foil is given a negative charge and the cathode a positive charge, the positively charged paint polymers migrate to the foil surface and are deposited thereon. A metallic catalyst or a cross-linking agent is added to the paint to promote the curing of the resin after it is applied to the surface to be coated. Preferred embodiments of the method and apparatus for preforming such electrocoating will be described hereinbelow Electrodeposition paints are well known, and many types are available commercially. Advantageously, the paint used in the practice of the present invention contains a polymer which not only provides the desired protection of the foil, but also is compatible with and provides good bonding strength to the resin of the printed circuit board substrate. The most widely used printed circuit board substrates employed are epoxy resins. Therefore, an epoxy paint is generally preferred for electrocoating the foil, although acrylic paints also have been found satisfactory for use as the cationic electrodeposition paint. Suitable commercially available epoxy cationic electrodeposition paints useful in the present invention are POWERCRON 620, EPOXY ED-3002 and EPOXY P500-612. Similarly, a suitable commercially available acrylic cationic electrodeposition paint is Acrylic P800-612. All of the above are manufactured by PPG Industries.

The cured resin or polymer, coating on the foil surface should have a thickness of from about 0.4 to 3 mils, and preferably of from about 0.8 mil to about 1.2 mils (25–40 g/m$^2$). Thinner coatings will not provide the desired protection of the foil, and thicker coatings are not necessary for printed circuit board use.

Many factors influence the thickness and quality of the resin electrodeposited on the foil. For example, increased temperature, voltage, time, solvent and solids content of the bath each tend to increase the thickness of the electredeposited coating. Decreasing the pH and conductivity of the bath each tend to increase the coating thickness. Therefore, it is necessary that the following electrodeposition conditions are employed in the present invention to provide a high quality electrocoated foil.

The temperature of the polymer bath should be maintained between about 65° F. and 100° F., and preferably from about 70° F. to 90° F. Temperatures below about 65° F. tend to result in uneven plating and surface defects, while temperatures above about 100° F. also tend to result in uneven thicknesses.

The solids content, i.e., the amount of resin in the total aqueous suspension, of the polymer bath is also important to obtaining a satisfactory coating on the foil. This solids content whould be maintained between about 40 and about 80 weight percent, and preferably between about 50 and about 70 weight per cent. With less than 40 weight percent solids, the electrodeposited polymer coating tends to be uneven because of the longer plating time and higher voltage required. Above 80 weight percent solids, there is a tendency for massive migration of the polymer particles from the bath, resulting in an uneven coating aving cracks, craters and pits.

The electrodeposition, or plating, time, i.e., the time current is applied to effect plating, must also be controlled. The speed at which the foil moves through the bath will determine the plating time. If the plating time is greater than about 15 seconds, the polymer coating tends to burn along the edges, to be pitted and have an uneven thickness. If less than about 2 seconds plating time is used, a high solids content is required in the bath and an uneven coating results. Therefore, in a typical electrocoating operation the foil moves through the bath at a speed in the range of from about 40–60 ft/min to about 80–90 ft/min.

If the electric potential, or voltage, applied across the anode and the foil is too high, the deposited polymer tends to become burned and the coating is uneven, resulting in an unsatisfactory product for printed circuit board use. If the applied voltage is too low, an uneven coating results. Therefore, it has been determined that the applied voltage should be in the range of from about 250 to about 450 V/sq.ft., and preferably in the range of about 300 to 450 V/sq.ft.

After the polymer is electrodeposited on the foil, the foil is rinsed with clean water to remove excess uncoated polymer, plating bath contamination and debris.

Following the above rinse, the coated foil is then heated to such a temperature and for such a time sufficient to cross-link and at least partially cure the polymer coating. It is preferred that the electrodeposited polymer coating is cured to the "B-stage", at which it is semi-cured, to provide better adhesion to the epoxy resin in the glass cloth laminate used in the manufacture of printed circuit boards. Also, the curing should be to such a degree that the partially cured resin is more than tack-free so that layers of the coated foil do not stick together when the foil is rolled or stacked. Therefore, the following curing conditions are employed in the present invention. When applying an epoxy coating, it is cured by heating in air to a temperature of from about 290° to about 340° F. for about 230 to 310 seconds. If an acrylic coating is used, it should be cured by heating in air to about 200° to about 450° F. for a time of from about 200 to about 350 seconds.

The operation of the process of the present invention will be described hereinbelow in connection with a preferred apparatus of the type shown in FIG. 1. The matte side of the copper foil is treated in the manner described in U.S. Letters Pat. No. Re. 30,180 and then stain-proofed in the manner described in U.S. Letters Pat. No. 3,853,716. The treated and stain-proofed copper foil 10 is unwound from a roll (not shown) and passed through a recirculating deionized water prewash 12 before being electrocoated with a cationic electrodeposition paint. This prewash removes residual ionic trace contamination on the foil, for example, $CrO_4^{-2}$, $Cl^-$, which otherwise may be carried into the electrocoating dispersion and, given sufficient time, would ultimately coagulate the polymer and seriously interfere with the electrocoating process. After being prewashed, the foil 10 moves at a speed of approximately 15 m/min over an electrical contact roll 14 into a polymer electrocoating tank 16 which contains an electrodeposition paint 18 which is an aqueous suspension of, for example, ZN6EZ506 epoxy resin and ZN6EA12 cross-linking agent, both manufactured by PPG Industries. The electrodeposition paint 18 comprises an aqueous suspension of the epoxy resin and a di-isocyanotic curing agent As described herein, only the matte side 10a of the foil is to be electrocoated with the epoxy resin, and it is important that no coating occurs on the shiney side 10b, opposite the matte side, of the foil. In order to accomplish this, i.e., to coat only the matte side of the foil, a rotating electrically-insulating drum 20 is supported in the electrocoating tank 16 and rotates in the direction of the foil movement (as shown by the arrows). The foil 10 initially contacts the outer surface of the drum 20 at a tangent point 22 located above the level 24 of the electrodeposition paint is in the electrocoating tank 16 and the foil 10 passes under the drum and is held against the outer surface of the rotating drum 20 by the tension in the strip of moving foil.

A series of closely spaced anodes 26 are immersed in the electrodeposition paint and spaced from the drum 20 around that portion of the periphery of the drum which is below the level of the paint 18 in the electrocoating tank 16. The foil 10 is rendered cathodic relative to the anodes 26, and each is connected to an opposite side of a direct current power supply (not shown). A voltage of 350 V/sq.ft. of the foil exposed to the electrodeposition paint is applied between the foil and the anodes.

Typically, the drum 20 has an outside diameter of 1 m and a width of 1.525 m (60 inches) to correspond to the width of the foil to be electrocoated. Beneath the drum 20 are a series of steel anode rods extending the width of the drum and arranged in parallel. The anode rods are surrounded by porous ceramic tubes which are, for example, Tecktron Tubular Electrodes available from Ultra Filter Systems Corp. The porous ceramic tubes act as electrodialysis membranes through which acid ions migrate and purge acid from the dispersion that otherwise would accumulate on the anodes and prevent electrodeposition of the resin from the paint.

The area of the foil surface upon which polymer is electrodeposited may be adjusted by altering the level 24 of the electrodeposition paint in the electrocoating tank 16, but this level should be kept below the tangent points of contact between the foil and the outer surface of the drum so that the paint does not contact the shiny side of the foil. The level 24 can be determined by the height of an over-flow wier 29 over which the paint flows into overflow trough 30.

The electrodeposition paint is circulated in the electrocoating tank 16 by a circulating pump 28 which takes suction from the overflow trough 30 of the electrocoating tank 16 and pumps the paint in sequence through a heat exchanger 32 capable of maintaining the temperature of the electrodeposition paint within ± 1° F. and then through a particle filter 34 having the capability of filtering out particles of 5 μm diameter and larger. Subsequently, the effluent from particle filter 34 is passed through an ultrafilter 36 which filters out particles of 1 μm and larger, after which the filtered paint is returned to the bottom of the electrocoating tank for circulation therein.

An electrodialysis pump 38 is employed to circulate the electrodeposition paint from an electrodialysis circulation tank 39 through the porous ceramic tubes surrounding the anodes 26.

After emerging from the polymer electrocoating tank 16 the foil 10 is passed over an exit roll 40, with the matte side 10a of the foil contacting the roll 40 which is used to aid in removing excess paint from the matte side before curing takes place. The foil 10 then passes to a recirculating reverse osmosis rinse water tank 41 system using substantially particle-free permeate as the final "super clean rinse".

The foil is rinsed with water to remove any excess polymer that may have adhered to it, as well as any loose surface contamination. This rinse water, with the contamination and polymer, may be recirculated by the use of a reverse osmosis membrane unit 43 to concentrate the polymer for reuse, while producing very clean water for the rinse cycle. A small proportion, e.g., about 5% of the reject usually will be sent via line 45 to effluent for disposal using an approved water/waste treatment method.

After rinsing the coated foil it is then passed over a final roll 42, with the shiny side of the foil contacting the roll and the coated matte side away from the roll.

From the final roll 42 the foil is passed to an infra red drying/curing oven 44 which heats the electrodeposited epoxy resin to a temperature of 325° F. The oven is positioned above the coating line so that the matte side of the foil does not contact the roll 42. Oven 44 is of a length such that the curing time, that is, the time the coated foil is within the oven, is 270 seconds.

Upon emerging from the drying/curing oven, the electrocoated resin on the foil is partially cured, e.g., to the "B-stage", so that it is slightly more than tack-free.

Figure 2:
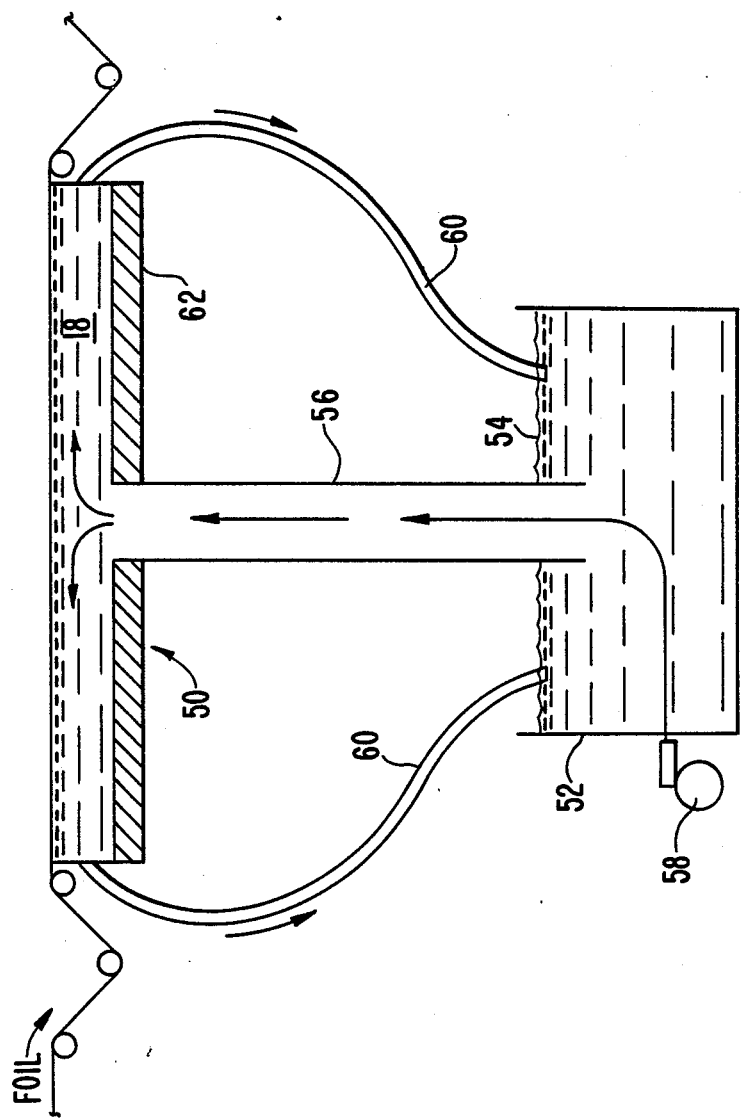
FIG. 2 is a schematic drawing illustrating another embodiment of apparatus for conducting the process of the present invention.

An alternative to the rotating drum and electrocoating system illustrated in FIG. 1 is shown in FIG. 2 wherein, for example, only the matte side of the foil is to be electrocoated with polymer paint. The apparatus of FIG. 2 is operated much the same as that of FIG. 1 except that a shallow electrocoating tray 50 is employed to contain the electrodeposition paint 18, rather than the electrocoating tank 16 and drum 20. Beneath the tray 50 there is positioned a paint reservoir 52 having a level 54 of paint therein. A riser 56 extends from below the paint level 54 upwardly to the bottom of tray 50 and a circulating pump 58 pumps the polymer solution upwardly through the riser 56 so that it fills tray 50 and overflows the top thereof into spaced-apart overflow conduits 60 which return the overflow paint to the reservoir 52.

In operation, the foil is drawn over the tray 50 and floats on the surface of the paint within the tray to coat, for example, the matte side of the foil, which is on the bottom side of the foil.

The bottom of tray 50 is formed of stainless steel plate 62 or another metal suitable for use as an anode. As before, the anode and the foil are connected between the terminals of a direct current power supply (not shown), with the foil being rendered cathodic relative to the anode, and a voltage is applied to the anode and cathode sufficient to cause the polymer particles to migrate to the cathode and are electrodeposited on the bottom side of the foil.

In this latter described system, the foil prewash, foil post-rinse, electrodialysis circulation system, filtering system and curing oven, along with the necessary rolls are not shown, but may be similar to the equivalent apparatus used in the previously described system.

A still further alternative apparatus for electrocoating the foil with the electrodeposition paint is shown in U.S. Pat. No. 4,469,565 wherein the electrodeposition paint flows vertically between at least vertical plate-like anode spaced from the foil which moves in a vertical direction. In such a system, the electrodeposition paint is pumped onto a surface of the foil and flows downwardly on the surface between the foil and the vertical anode into a reservoir beneath the foil and the anode wherein the paint is collected and recirculated onto the surface of the foil.

Having described preferred embodiments of the present invention, it is to be understood that variations and modifications thereof falling within the spirit and scope of the appended claims may become apparent to one skilled in the art and that the scope of the present invention is to be limited only by the appended claims and their equivalents.

What is claimed is:

1. A continuous process for electrodepositing a resinous coating on a surface of a treated copper foil which process comprises:
   (a) passing a strip of copper foil, at least one side of which has a matte surface which has been treated to increase its surface area, through a bath of a cationic electrodeposition paint in an electrolytic cell, the paint comprising an aqueous dispersion of particles of a resin to be electrodeposited;
   (b) rendering the foil cathodic with respect to an insoluble anode spaced apart from the foil in the cell;
   (c) maintaining an electric potential between the treated surface of the foil and said anode means under electrodeposition conditions to electrodeposit a uniform coating of the resin on the treated surface of the foil; and
   (d) curing the deposited resin to form a solid, protective coating of the resin on the treated surface of the foil.

2. The process of claim 1, wherein the resin is an epoxy or acrylic resin.

3. The process of claim 1, wherein the electrodeposition conditions include a temperature of from about 65° F. to about 100° F., said electric potential is from about 250 V/ft$^2$ to about 450V/ft$^2$ and an electrodeposition time of from about 2 sec. to about 15 sec., and the bath contains from about 40% to about 80%, by weight of solids.

4. The process of claim 3, wherein said curing is conducted at a temperature of from about 200° F. to about 450° F. for a time of about 200 sec. to about 350 sec.

5. The process of claim 1, wherein said foil has a matte surface which has been treated by electrochemically depositing at least one copper layer thereon to increase the surface area thereof.

6. The process of claim 5, wherein prior to said treating, said matte surface has been pre-treated electrochemically in an arsenic and copper-containing electrolyte to form a first copper layer on said matte surface followed by electrodepositing a gilding copper layer thereon.

7. The process of claim 6, wherein prior to electrodepositing said resinous coating said treated matte surface has bee stain-proofed by electrolytically depositing on said treated matte surface copper and chromium ions.

8. The process of claim 1, wherein the cured resin coating has a thickness of from about 0.4 mils to 3 mils.

9. The product of the process of claim 1.

10. The product of the process of claim 3.

11. The product of the process of claim 5.

* * * * *